(12) United States Patent
Fujita et al.

(10) Patent No.: US 8,753,921 B2
(45) Date of Patent: Jun. 17, 2014

(54) MANUFACTURING METHOD FOR SEMICONDUCTOR DEVICE

(75) Inventors: Tetsuo Fujita, Osaka (JP); Yukinobu Nakata, Osaka (JP); Tohru Daitoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/823,247

(22) PCT Filed: Sep. 9, 2011

(86) PCT No.: PCT/JP2011/070562
§ 371 (c)(1),
(2), (4) Date: Mar. 14, 2013

(87) PCT Pub. No.: WO2012/036079
PCT Pub. Date: Mar. 22, 2012

(65) Prior Publication Data
US 2013/0171771 A1 Jul. 4, 2013

(30) Foreign Application Priority Data

Sep. 15, 2010 (JP) .................................. 2010-206785

(51) Int. Cl.
*H01L 21/00* (2006.01)
*H01L 21/16* (2006.01)
*C23C 14/00* (2006.01)
*C25B 11/00* (2006.01)
*C25B 13/00* (2006.01)

(52) U.S. Cl.
USPC .......................... 438/104; 257/43; 204/298.12

(58) Field of Classification Search
None
See application file for complete search history.

(56) References Cited

U.S. PATENT DOCUMENTS

| 5,372,694 | A | * | 12/1994 | Szczyrbowski | 204/298.12 |
| 2004/0140206 | A1 | * | 7/2004 | Voutsas et al. | 204/298.13 |
| 2006/0266639 | A1 | * | 11/2006 | Le et al. | 204/192.1 |
| 2010/0025677 | A1 | * | 2/2010 | Yamazaki et al. | 257/43 |

FOREIGN PATENT DOCUMENTS

| JP | 61-166964 A | 7/1986 |
| JP | 63-143258 A | 6/1988 |
| JP | 63-183262 U | 11/1988 |
| JP | 2003-027227 A | 1/2003 |
| JP | 2003-298062 A | 10/2003 |

(Continued)

OTHER PUBLICATIONS

English translation of Official Communication issued in corresponding International Application PCT/JP2011/070562, mailed on Apr. 18, 2013.

(Continued)

*Primary Examiner* — Evan Pert
(74) *Attorney, Agent, or Firm* — Keating & Bennett, LLP

(57) ABSTRACT

A method for producing a semiconductor device according to the present invention includes a step of sputtering a target (100A). The target (100A) includes a plurality of target tiles (11A) located while having a gap therebetween; a backing plate (15A) for supporting the plurality of target tiles (11A); and a bonding member (17A) provided between the backing plate (15A) and the plurality of target tiles (11A). The plurality of target tiles (11A) each contain In, Ga and Zn. When the target (100A) is seen in a direction normal thereto from the side on which the plurality of target tiles (11A) are located, the plurality of target tiles (11A) are each smaller than an insulating substrate (1), and the bonding member (17A) cannot be seen through the gap.

3 Claims, 7 Drawing Sheets

(56) References Cited

FOREIGN PATENT DOCUMENTS

| JP | 2004-143548 A | 5/2004 |
|----|---------------|--------|
| JP | 2007-051308 A | 3/2007 |
| JP | 2007-123699 A | 5/2007 |
| JP | 2008-050654 A | 3/2008 |

OTHER PUBLICATIONS

Official Communication issued in International Patent Application No. PCT/JP2011/070562, mailed on Dec. 6, 2011.

* cited by examiner (a)

(b)

(a)

(b)

(a)

(b)

(a)

(b)

MANUFACTURING METHOD FOR SEMICONDUCTOR DEVICE

TECHNICAL FIELD

The present invention relates to a semiconductor device including a thin film transistor and a method for producing the same.

BACKGROUND ART

Recently, it has been proposed to form an active layer of a TFT (Thin Film Transistor) by use of an oxide semiconductor film of zinc oxide or the like instead of a silicon semiconductor film. A TFT including an oxide semiconductor film is referred to as an "oxide semiconductor TFT". An oxide semiconductor such as zinc oxide or the like has a mobility higher than that of amorphous silicon. Therefore, an oxide semiconductor TFT can be operated faster than a TFT using amorphous silicon. In addition, an oxide semiconductor film may be formed by a sputtering method. Therefore, an oxide semiconductor TFT has an advantage of being applicable to a larger-screen display device than a TFT using polycrystalline silicon (see, for example, Patent Documents 1 and 2).

According to a sputtering method, a film is formed by use of a target. A magnetron sputtering method is especially widely used in mass production system. According to this method, a magnet is located on a rear surface of the target to generate a magnetic field on a surface of the target, so that plasma is converged to the vicinity of the surface of the target. A target is generally produced as follows. In (indium) or solder is used as a brazing material, and a target tile is bonded to a support (backing plate) formed of Cu (copper). As the production devices have been enlarged, the targets have also been enlarged. Patent Document 3 discloses a method for solving problems caused by such an enlarged target.

CITATION LIST

Patent Literature

Patent Document 1: Japanese Laid-Open Patent Publication No. 2003-298062
Patent Document 2: Japanese Laid-Open Patent Publication No. 2007-123699
Patent Document 3: Japanese Laid-Open Patent Publication No. 2004-143548

SUMMARY OF INVENTION

Technical Problem

However, a display device including an oxide semiconductor TFT has not been mass-produced yet, and urgent establishment of a technology for mass production thereof is now desired.

The present invention made in light of the above-described points has an object of providing a semiconductor device production method which is suitable to mass production of a semiconductor device, such as a display device, including an oxide semiconductor TFT, and a semiconductor device produced by such a production method.

Solution to Problem

A method for producing a semiconductor device including an oxide semiconductor TFT according to the present invention includes the steps of preparing an insulating substrate; and forming an oxide semiconductor layer on the insulating substrate. The step of forming the oxide semiconductor layer includes the step of sputtering a target; the target includes a plurality of target tiles located while having a gap therebetween; at least one backing plate for supporting the plurality of target tiles; and at least one bonding member provided between the at least one backing plate and the plurality of target tiles; and the plurality of target tiles each contain In, Ga and Zn; and when the target is seen in a direction normal thereto from the side on which the plurality of target tiles are located, the plurality of target tiles are each smaller than the insulating substrate, and the at least one bonding member cannot be seen through the gap.

In an embodiment, the at least one backing plate includes a plurality of backing plates; the at least one bonding member include a plurality of bonding members; and the plurality of target tiles are each bonded to at least one of the plurality of backing plates via at least one of the plurality of bonding members.

In an embodiment, when the target is seen in a direction normal thereto from the side on which the plurality of target tiles are located, the plurality of target tiles are each larger than the at least one of the plurality of bonding members.

In an embodiment, the plurality of target tiles each have an inclining side surface; and when the target is seen in a direction normal thereto from the side on which the plurality of target tiles are located, the inclining side surface of one of two adjacent target tiles of the plurality of target tiles at least partially overlaps the inclining side surface of the other of the two adjacent target tiles.

In an embodiment, the plurality of target tiles each have a side surface having a step-like cross-section; and when the target is seen in a direction normal thereto from the side on which the plurality of target tiles are located, the side surface of one of two adjacent target tiles of the plurality of target tiles at least partially overlaps the side surface of the other of the two adjacent target tiles.

In an embodiment, the plurality of target tiles each have a side surface having a curved cross-section; and when the target is seen in a direction normal thereto from the side on which the plurality of target tiles are located, the side surface of one of two adjacent target tiles of the plurality of target tiles at least partially overlaps the side surface of the other of the two adjacent target tiles.

Advantageous Effects of Invention

According to the present invention, a semiconductor device production method which is suitable to mass production of a semiconductor device, such as a display device, including an oxide semiconductor TFT, and a semiconductor device produced by such a production method are provided.

DESCRIPTION OF EMBODIMENTS

Hereinafter, a semiconductor device production method and a semiconductor device (herein, a TFT substrate) produced by such a production method, both in an embodiment according to the present invention, will be described with reference to the drawings. The TFT substrate in this embodiment encompasses a TFT substrate of any of various types of devices (e.g., liquid crystal display device and EL display device).

Herein, a TFT substrate of a liquid crystal display device which includes an oxide semiconductor TFT as a switching device, and a method for producing the same will be described as an example.

Figure 1:
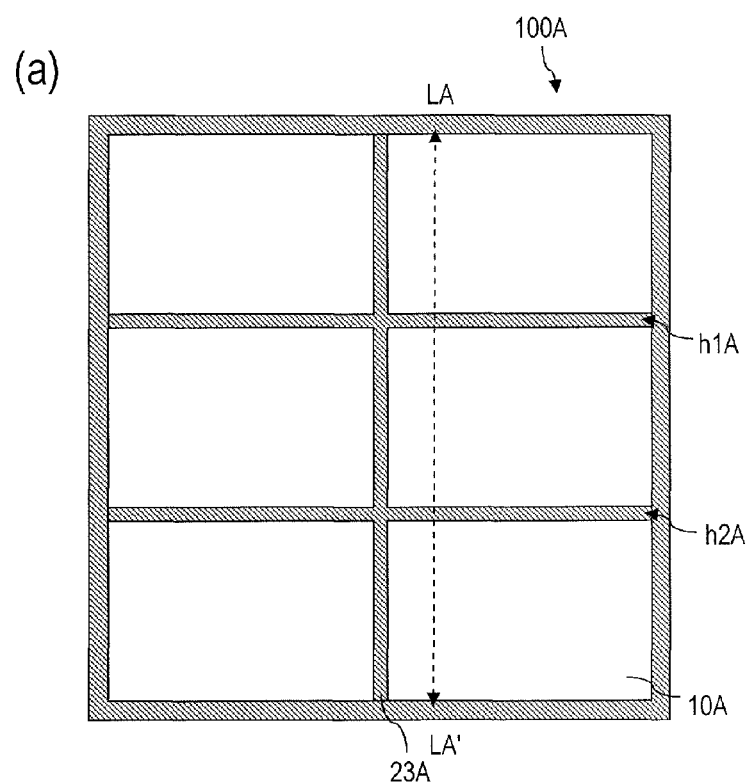
FIG. 1(a) is a schematic plan view provided for explaining a target 100A usable for a production method in an embodiment according to the present invention.
FIG. 1(b) is a schematic cross-sectional view taken along line LA-LA' in FIG. 1(a).
Figure 1:
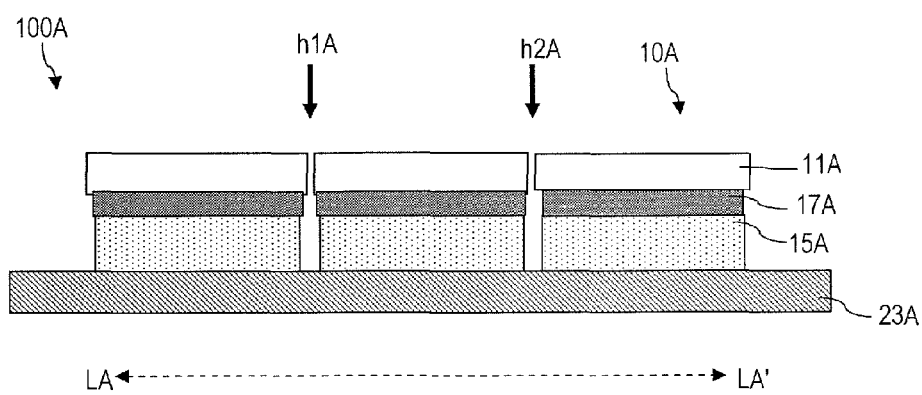

With reference to FIG. 1, a target 100A usable for a method for producing a TFT substrate in an embodiment according to the present invention will be described.

FIG. 1(a) is a schematic plan view provided for explaining the target 100A usable for a method for producing a TFT substrate in an embodiment according to the present invention. FIG. 1(b) is a schematic cross-sectional view taken along line LA-LA' in FIG. 1(a). Line LA-LA' is along a magnetic fluctuation direction.

As shown in FIGS. 1(a) and 1(b), the target 100A includes a plurality of (e.g., six) target tile assemblies 10A located while having gaps h1A and h2A therebetween. The plurality of target tile assemblies 10A each include a target tile 11A containing, for example, In, Ga (gallium) and Zn (zinc), a first backing plate (first support) 15A for supporting the target tile 11A, and a bonding member (containing, for example, In (4N grade)) 17A for bonding the target tile 11A and the first backing plate 15A to each other. Each of the target tiles 11A are generally parallelepiped, and has corners rounded at R=0.1 mm or greater (not shown). Such rounding prevents concentration of an electric field at a particular position. The target tile 11A may be supported by a plurality of first backing plates 15A. The plurality of first backing plates 15A are supported by, for example, one second backing plate 23A (second support). The plurality of target tile assemblies 10A are located in a pattern of, for example, two rows by three columns. The target tile assemblies 10A have, for example, the same size as one another. The second backing plate 23A has a function of, for example, cooling the target tiles 11A. The second backing plate 23A is connected to a power supply used for sputtering.

In each target tile assembly 10A, the target tile 11A has a size which is larger than, or equal to, the size of the bonding member 17A and also the size of the first backing plate 15A. Therefore, when the target 100A is seen in a direction normal thereto from the side on which the target tiles 11A are located, the bonding members 17A and the first backing plates 15A are covered with the target tiles 11A and thus cannot be seen. Since the bonding members 17A are covered with the target tiles 11A, when sputtering is performed by use of the target 100A, the influence of plasma at the time of sputtering is not exerted on the bonding members 17A. The target tiles 11A each have a size which is smaller than the size of an insulating substrate on which an oxide semiconductor film is to be formed by deposition. Each target tile 11A has a thickness of, for example, 5 mm or greater and 20 mm or less.

In the case where oxide semiconductor layers (e.g., oxide semiconductor layers containing In, Ga and Zn (IGZO layers)) are formed on one substrate by sputtering by use of the target 100A including the plurality of target tiles 11A located as described above, the oxide semiconductor layers have a uniform quality. As a result, TFTs obtained as final products have a uniform characteristic with small dispersion. By contrast, as described later, a target 500 has a structure by which when the target is seen in a direction normal thereto from the side on which target tiles are provided, the bonding member is seen through gaps between the target tiles. In the case where oxide semiconductor layers are formed by sputtering by use of the target 500, the quality of the oxide semiconductor layers is not uniform. As a result, the characteristic of TFTs obtained as final products is not uniform and has large dispersion.

Hereinafter, targets 100B through 100E which are each usable for a method for producing a TFT substrate in another embodiment and have the same effect as that of the target 100A will be described.

Figure 2:
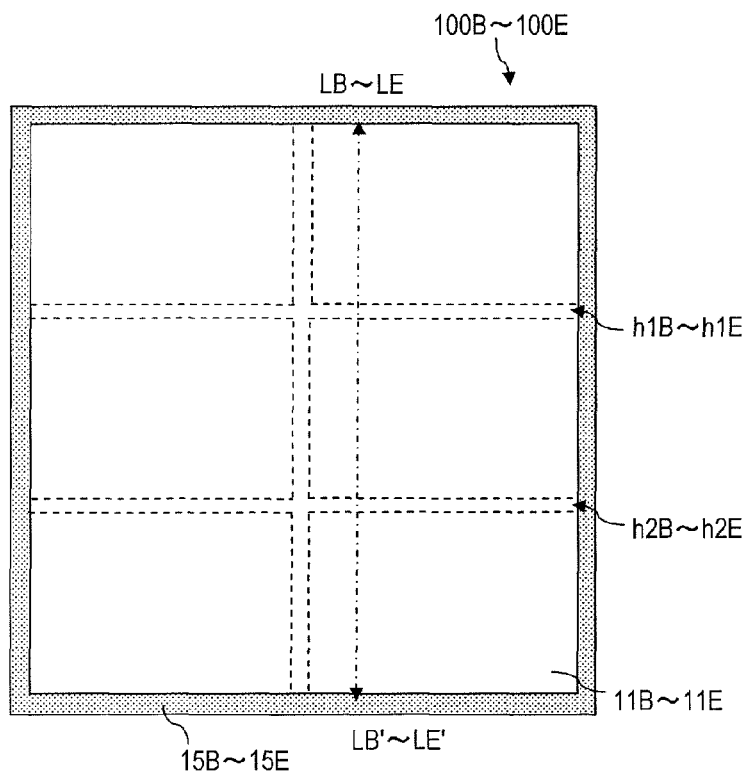
FIG. 2 is a schematic plan view provided for explaining targets 100B through 100E each usable for a production method in another embodiment according to the present invention
Figure 3:
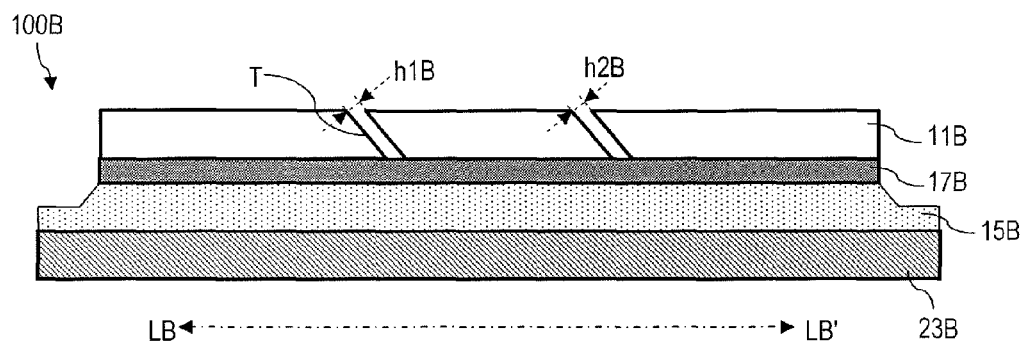
FIG. 3 is a schematic cross-sectional view of the target 100B taken along line LB-LB' in FIG. 2.

With reference to FIGS. 2 and 3, the target 100B usable for a method for producing a TFT substrate in another embodiment according to the present invention will be described.

FIG. 2 is a schematic plan view provided for explaining the targets 100B through 100E each usable for a method for producing a TFT substrate in another embodiment according to the present invention. FIG. 3 is a schematic cross-sectional view taken along line LB-LB' in FIG. 2. Line LB-LB' is along a magnetic fluctuation direction.

As shown in FIGS. 2 and 3, the target 100B includes a plurality of (e.g., six) target tiles 11B located while having gaps h1B and h2B therebetween. The target 100B further includes a first backing plate 15B for supporting the target tiles 11B, and a bonding member 17B for bonding the target tiles 11B and the first backing plate 15B to each other.

Each of the plurality of target tiles 11B contains, for example, In, Ga and Zn, and has an inclining side surface T. When the target 100B is seen in a direction normal thereto from the side on which the target tiles 11B are located, the inclining side surface T of one of two adjacent target tiles at least partially overlaps the inclining side surface T of the other of the two adjacent target tiles. The inclining side surfaces T each have a tapering angle which is adjusted such that even when the thickness of the target 100B is reduced as a result of sputtering, the bonding member 17B is not seen. Each of the target tiles 11B has corners rounded at R=0.1 mm or greater (not shown).

The plurality of target tiles 11B are supported by, for example, one first backing plate 15B. The target tiles 11B each have a size which is smaller than the size of the first backing plate 15B. The target tiles 11B each have a thickness of, for example, 5 mm or greater and 20 mm or less. The first backing plate 15B is supported by, for example, one second backing plate 23B. The target tiles 11B are located in a pattern of, for example, two rows by three columns. The target tiles 11B have, for example, the same size as one another. The target tiles 11B each have a size which is smaller than the size of an insulating substrate on which an oxide semiconductor film is to be formed by deposition. The second backing plate 23B has a function of, for example, cooling the target tiles 11B. The second backing plate 23B is connected to a power supply used for sputtering. The target 100B may have a structure of including a plurality of target tile assemblies as the target 100A described above.

When the target 100B is seen in a direction normal thereto from the side on which the target tiles 11B are located, the bonding member 17B and the first backing plate 15B are covered with the target tiles 11B and thus cannot be seen through the gaps.

Figure 4:
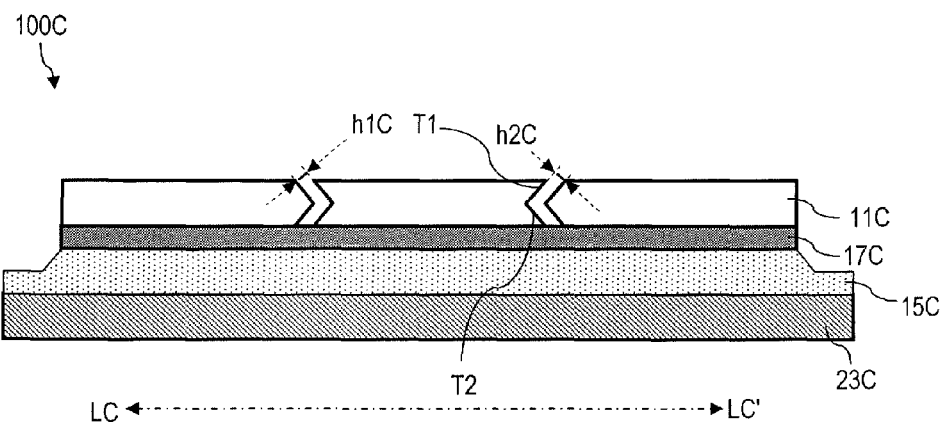
FIG. 4 is a schematic cross-sectional view of the target 100C taken along line LC-LC' in FIG. 2.

Now, with reference to FIGS. 2 and 4, the target 100C usable for a method for producing a TFT substrate in still another embodiment according to the present invention will be described. FIG. 4 is a schematic cross-sectional view taken along line LC-LC' in FIG. 2. Line LC-LC' is along a magnetic fluctuation direction.

As shown in FIGS. 2 and 4, the target 100C includes a plurality of (e.g., six) target tiles 11C located while having gaps h1C and h2C therebetween. The target 100C further includes a first backing plate 15C, and a bonding member 17C for bonding the target tiles 11C and the first backing plate 15C to each other.

Each of the plurality of target tiles 11C contains, for example, In, Ga and Zn, and has inclining side surfaces T1 and T2 extending in different directions from each other. When the target 100C is seen in a direction normal thereto from the side on which the target tiles 11C are located, the inclining side surfaces T1 and T2 of one of two adjacent target tiles at least partially overlap the inclining side surfaces T1 and T2 of the other of the two adjacent target tiles. The inclining side surfaces T1 and T2 each have a tapering angle which is adjusted such that even when the thickness of the target 100C is reduced as a result of sputtering, the bonding member 17C is not seen. Each of the target tiles 11C has corners rounded at R=0.1 mm or greater (not shown).

The plurality of target tiles 11C are supported by, for example, one first backing plate 15C. The first backing plate 15C is supported by, for example, one second backing plate 23C. The target tiles 11C each have a size which is smaller than the size of the first backing plate 15C. The target tiles 11C each have a thickness of, for example, 5 mm or greater and 20 mm or less. The target tiles 11C are located in a pattern of, for example, two rows by three columns. The target tiles 11C have, for example, the same size as one another. The target tiles 11C each have a size which is smaller than the size of an insulating substrate on which an oxide semiconductor film is to be formed by deposition. The second backing plate 23C has a function of, for example, cooling the target tiles 11C. The second backing plate 23C is connected to a power supply used for sputtering. The target 100C may have a structure of including a plurality of target tile assemblies as the target 100A described above.

When the target 100C is seen in a direction normal thereto from the side on which the target tiles 11C are located, the bonding member 17C and the first backing plate 15C are covered with the target tiles 11C and thus cannot be seen through the gaps.

Now, with reference to FIGS. 2 and 5, the target 100D usable for a method for producing a TFT substrate in still another embodiment according to the present invention will be described.

Figure 5:
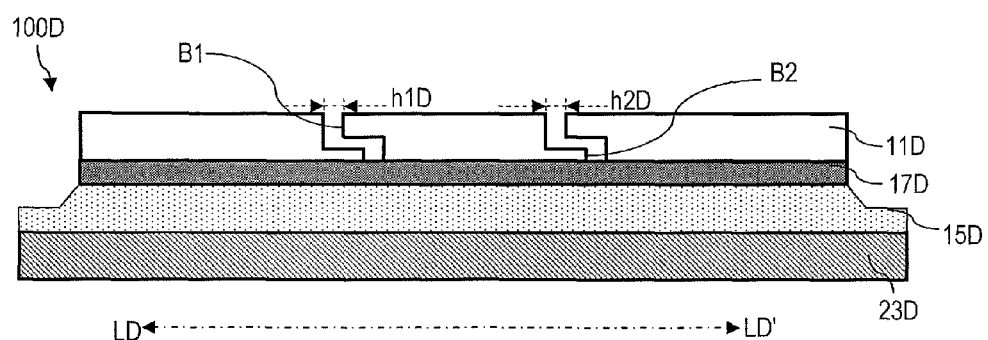
FIG. 5 is a schematic cross-sectional view of the target 100D taken along line LD-LD' in FIG. 2.

FIG. 5 is a schematic cross-sectional view taken along line LD-LD' in FIG. 2. Line LD-LD' is along a magnetic fluctuation direction.

As shown in FIGS. 2 and 5, the target 100D includes a plurality of (e.g., six) target tiles 11D located while having gaps h1D and h2D therebetween. The target 100D further includes a first backing plate 15D, and a bonding member 17D for bonding the target tiles 11D and the first backing plate 15D to each other.

Each of the plurality of target tiles 11D contains, for example, In, Ga and Zn, and has a side surface having a step-like cross-section. When the target 100D is seen in a direction normal thereto from the side on which the target tiles 11D are located, the side surface of one of two adjacent target tiles at least partially overlaps the side surface of the other of the two adjacent target tiles. The step-like side surfaces each have a convexed portion B1 or B2. The convexed portion B2 is located on the side of a surface of the target tile 11D closer to the bonding member 17D, and the convexed portion B1 is located on the side of a surface of the target tile 11D opposite to the surface closer to the bonding member 17D. The convexed portion B1 is thicker than the convexed portion B2. The position of each target tile 11D and the thickness of the convexed portion B1 are designed such that even when the thickness of the target 100D is reduced as a result of sputtering, the convexed portion B1 exists. Each of the target tiles 11D has corners rounded at R=0.1 mm or greater (not shown).

The plurality of target tiles 11D are supported by, for example, one first backing plate 15D. The target tiles 11D each have a size which is smaller than the size of the first backing plate 15D. The target tiles 11D each have a thickness of, for example, 5 mm or greater and 20 mm or less. The first backing plate 15D is supported by, for example, one second backing plate 23D. The target tiles 11D are located in a pattern of, for example, two rows by three columns. The target tiles 11D have, for example, the same size as one another. The target tiles 11D each have a size which is smaller than the size of an insulating substrate on which an oxide semiconductor film is to be formed by deposition. The second backing plate 23D has a function of, for example, cooling the target tiles 11D. The second backing plate 23D is connected to a power supply used for sputtering. The target 100D may have a structure of including a plurality of target tile assemblies as the target 100A described above.

When the target 100D is seen in a direction normal thereto from the side on which the target tiles 11D are located, the bonding member 17D and the first backing plate 15D are covered with the target tiles 11D and thus cannot be seen through the gaps.

Now, with reference to FIGS. 2 and 6, the target 100E usable for a method for producing a TFT substrate in still another embodiment according to the present invention will be described.

Figure 6:
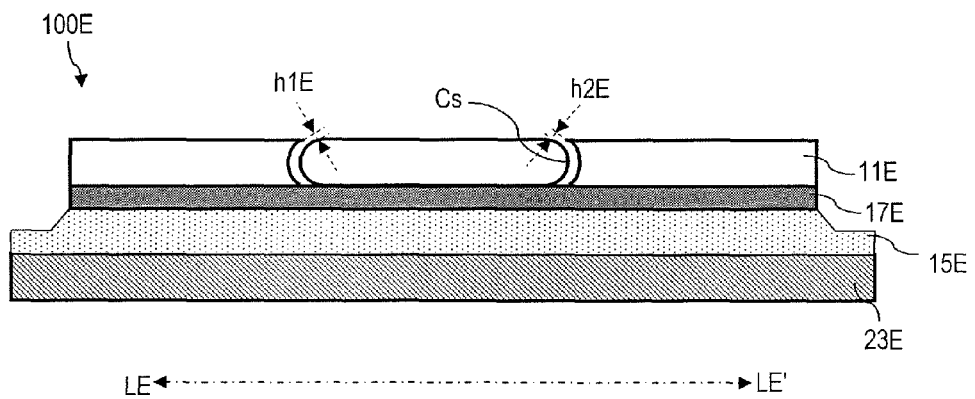
FIG. 6 is a schematic cross-sectional view of the target 100E taken along line LE-LE' in FIG. 2.

FIG. 6 is a schematic cross-sectional view taken along line LE-LE' in FIG. 2. Line LE-LE' is along a magnetic fluctuation direction.

As shown in FIGS. 2 and 6, the target 100E includes a plurality of (e.g., six) target tiles 11E located while having gaps h1E and h2E therebetween. The target 100E further includes a first backing plate 15E, and a bonding member 17E for bonding the target tiles 11E and the first backing plate 15E to each other.

Each of the plurality of target tiles 11E contains, for example, In, Ga and Zn, and has a side surface Cs having a curved cross-section. When the target 100E is seen in a direction normal thereto from the side on which the target tiles 11E are located, the side surface Cs of one of two adjacent target tiles at least partially overlaps the side surface Cs of the other of the two adjacent target tiles. The side surfaces Cs are each rounded such that even when the thickness of the target 100E is reduced as a result of sputtering, the bonding member 17E is not seen. Each of the target tiles 11E has corners rounded at R=0.1 mm or greater (not shown).

The plurality of target tiles 11E are supported by, for example, one first backing plate 15E. The target tiles 11E each have a size which is smaller than the size of the first backing plate 15E. The target tiles 11E each have a thickness of, for example, 5 mm or greater and 20 mm or less. The target tiles 11E each have a size which is smaller than the size of an insulating substrate on which an oxide semiconductor film is to be formed by deposition. The first backing plate 15E is supported by, for example, one second backing plate 23E. The target tiles 11E are located in a pattern of, for example, two rows by three columns. The target tiles 11E have, for example, the same size as one another. The second backing plate 23E has a function of, for example, cooling the target tiles 11E. The second backing plate 23E is connected to a power supply used for sputtering. The target 100E may have a structure of including a plurality of target tile assemblies as the target 100A described above.

When the target 100E is seen in a direction normal thereto from the side on which the target tiles 11E are located, the bonding member 17E and the first backing plate 15E are covered with the target tiles 11E and thus cannot be seen through the gaps.

The plurality of target tiles 11A through 11E are located while having the gaps h1A through h1E and h2A through h2E therebetween. The gaps h1A through h1E and h2A through h2E each have a size of 0.2 mm or greater and 0.5 mm or less. Owing to such a positioning arrangement, the targets 100A through 100E are prevented from being cracked.

Figure 7:
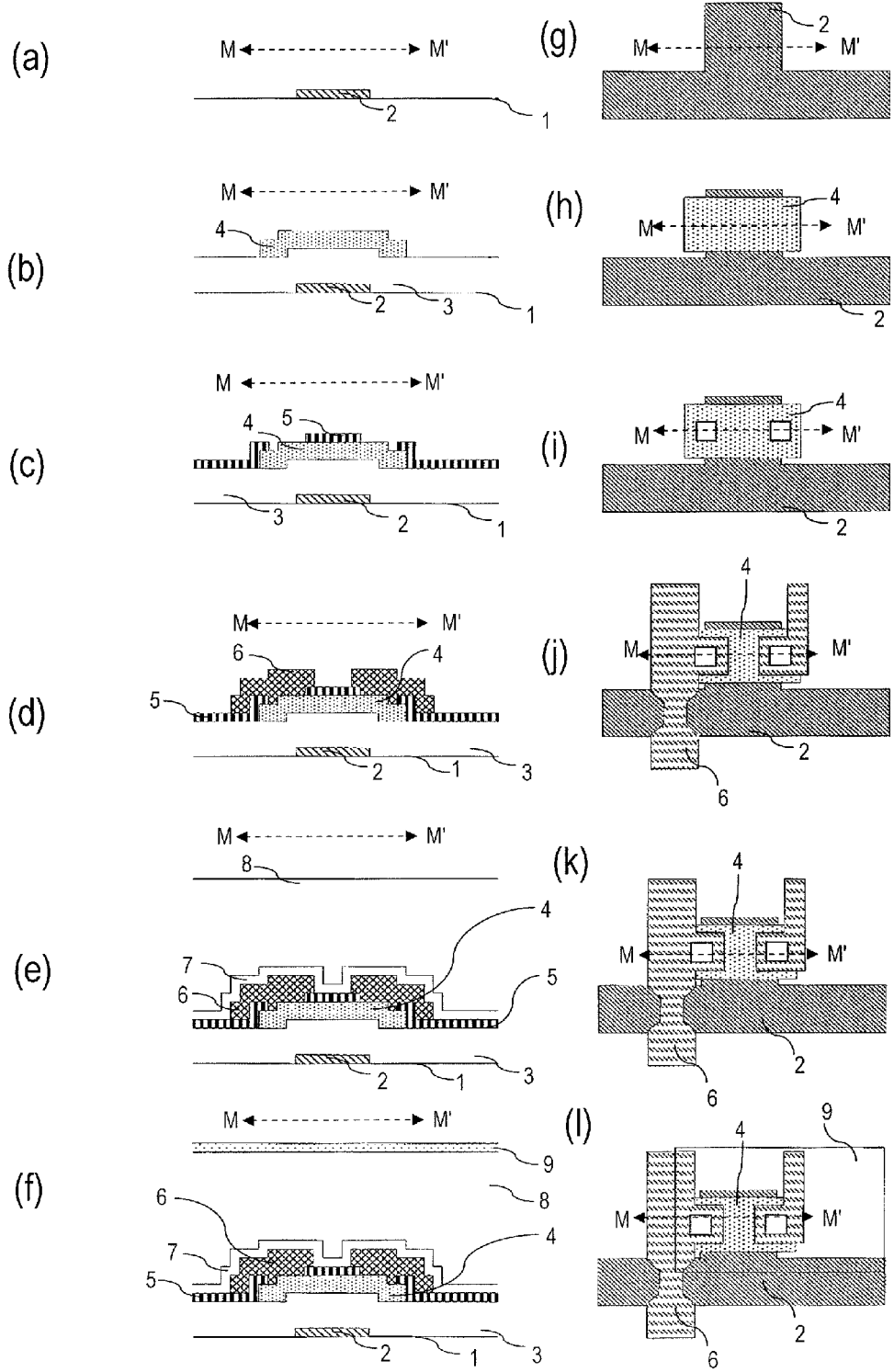
FIGS. 7(a) through 7(f) are schematic cross-sectional views provided for explaining a production method in an embodiment according to the present invention.
FIGS. 7(g) through 7(l) are schematic plan views provided for explaining the production method in the embodiment according to the present invention, taken along line M-M' in FIGS. 7(a) through 7(f).

Now, with reference to FIG. 7, a method for producing an oxide semiconductor TFT using any one of the targets 100A through 100E will be described. FIGS. 7(a) through 7(f) are schematic cross-sectional views provided for explaining a production method in an embodiment according to the present invention. FIGS. 7(g) through 7(l) are schematic plan views provided for explaining the production method in the embodiment according to the present invention, taken along line M-M' in FIGS. 7(a) through 7(f).

First, as shown in FIGS. 7(a) and 7(g), a gate electrode 2 is formed on an insulating substrate 1 (e.g., glass substrate) by a known method. The gate electrode 2 has a stacking structure of, for example, TiN (titanium nitride)/Ti (titanium)/Al (aluminum) (Al is used to form the lowest layer). The gate electrode 2 has a thickness of, for example, 1900 nm.

Next, as shown in FIGS. 7(b) and 7(h), a gate insulating layer 3 is formed by a known method. The gate insulating layer 3 has a stacking structure of, for example, $SiO_2$ (silicon dioxide)/SiN (silicon nitride). The gate insulating layer 3 has a thickness of, for example, 375 nm.

Next, an IGZO film is formed on the gate insulating layer 3 by sputtering, and then the IGZO film is formed into an island pattern as an IGZO layer 4 by a known method. The IGZO layer 4 having the island pattern has a thickness of, for example, 50 nm. For forming the IGZO film by sputtering, any one of the targets 100A through 100E is used. In this embodiment, conditions for forming the IGZO film are as follows.

The temperature of the insulating substrate at the time of film formation is 200° C., and gas used for film formation is Ar (argon)/$O_2$. The gas is introduced into a chamber at a flow rate of 200/9 sccm. The pressure of the chamber is adjusted to about 0.3 Pa. The film is formed by DC magnetron sputtering at a power density of 1.5 W/cm$^2$ so as to have a desired thickness.

When any one of the targets 100A through 100E is used, the corresponding bonding member among the bonding members 17A through 17E is covered with the corresponding target tiles among the target tiles 11A through 11E. Therefore, at the time of formation of the IGZO film, the influence of the corresponding bonding member among the bonding members 17A through 17E can be reduced. As a result, the IGZO film has a uniform quality, and thus a plurality of oxide semiconductor TFTs obtained as final products have a uniform characteristic.

Next, as shown in FIGS. 7(c) and 7(i), an etching stopper layer 5 is formed on the IGZO layer 4 by a known method. The etching stopper layer 5 is formed of, for example, $SiO_2$, and has a thickness of, for example, 150 nm.

Next, annealing is performed, for example, at a temperature of 350° C. for 2 hours.

Next, as shown in FIGS. 7(d) and 7(j), source and drain electrodes 6 are formed on the IGZO layer 4 by a known method. The source and drain electrodes 6 each have a stacking structure of, for example, MoN (molybdenum nitride)/Al/MoN. The source and drain electrodes 6 each have a thickness of, for example, 200 nm.

Next, as shown in FIGS. 7(e) and 7(k), an inorganic interlayer insulating layer 7 is formed on the source and drain electrodes 6 by a known method. The inorganic interlayer insulating layer 7 is formed of, for example, $SiO_2$. The inorganic interlayer insulating layer 7 has a thickness of, for example, 265 nm.

Next, annealing is performed, for example, at a temperature of 250° C. for 1 hour.

Next, the gate insulating layer and the inorganic interlayer insulating layer 7 are formed into a desired pattern by a known method.

Next, an organic interlayer insulating layer 8 is formed on the inorganic interlayer insulating layer 7 by photolithography. The organic interlayer insulating layer 8 has a thickness of, for example, 3 μm.

Next, annealing is performed, for example, at a temperature of 220° C. for 1 hour.

Next, as shown in FIGS. 7(f) and 7(l), a pixel electrode 9 is formed by a known method so as to contact with the drain electrode. The pixel electrode 9 is formed of, for example, ITO (Indium Tin Oxide). The pixel electrode 9 has a thickness of, for example, 70 nm.

Next, annealing is performed, for example, at a temperature of 215° C. for 37 minutes.

The TFT substrate including an oxide semiconductor TFT in the embodiment according to the present invention is produced by the above-described steps.

Now, advantages of a semiconductor device production method in this embodiment over a production method using a target in a comparative example will be described.

Figure 8:
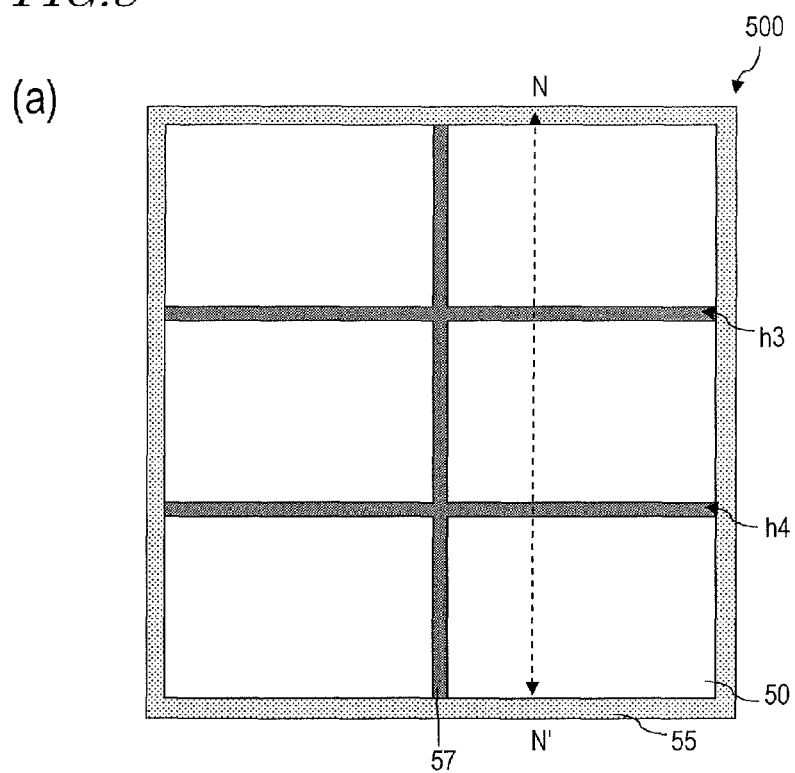
FIG. 8(a) is a schematic plan view provided for explaining a target 500 used for a production method in a comparative example.
FIG. 8(b) is a schematic cross-sectional view taken along line N-N' in FIG. 8(a).
Figure 8:
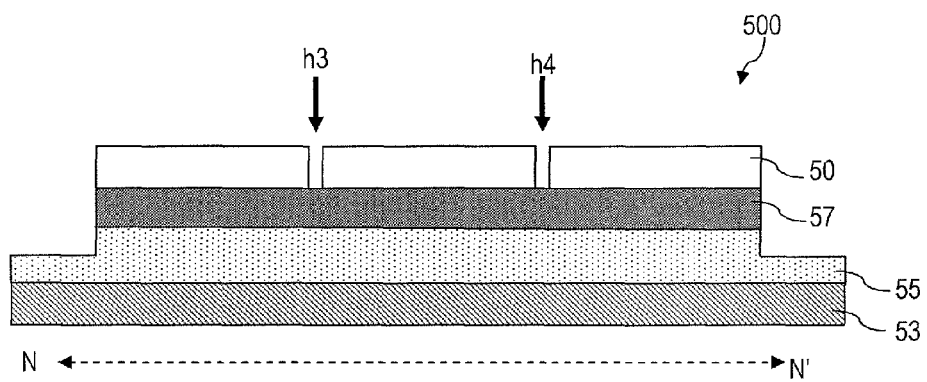

FIG. 8 is a schematic view provided for explaining the target 500 in a comparative example.

FIG. 8(a) is a schematic plan view provided for explaining the target 500 used in a method for producing a TFT substrate in the comparative example. FIG. 8(b) is a schematic cross-sectional view taken along line N-N' in FIG. 8(a). Line N-N' is along a magnetic fluctuation direction.

The target 500 includes a plurality of target tiles 50. The plurality of target tiles 50 are located while having gaps h3 and h4 therebetween. The target 500 further includes one first backing plate 55 for supporting the plurality of target tiles 50, and a bonding member (containing, for example, In) 57 for bonding the plurality of target tiles 50 and the first backing plate 55A to each other. The target 500 further includes one second backing plate 53 for supporting the first backing plate 55.

Unlike the targets 100A through 100E, the target 500 has a structure by which when the target is seen in a direction normal thereto from the side on which the target tiles 50 are located, the bonding member 57 is seen through the gaps h3 and h4.

Figure 9:
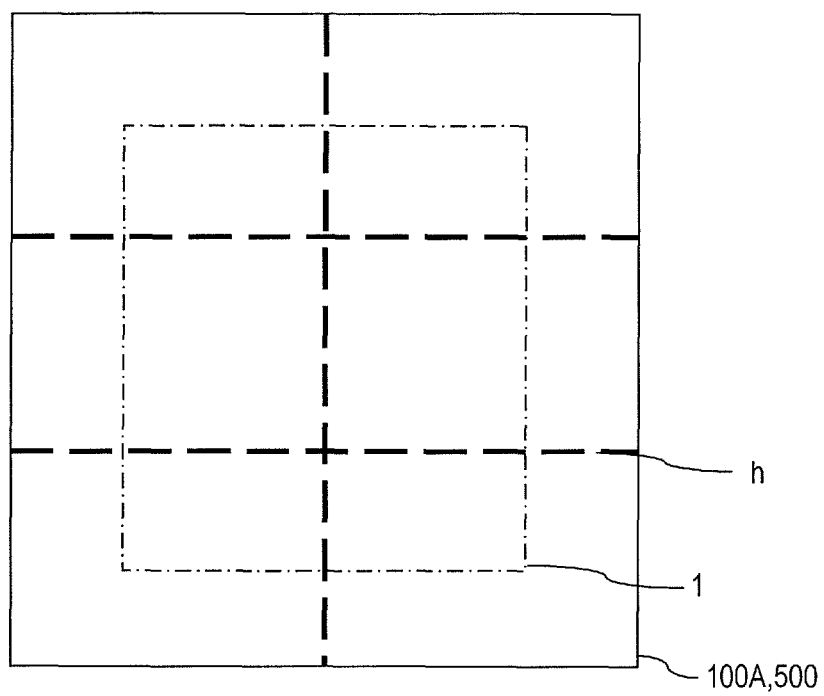
FIG. 9(a) is a schematic plan view provided for explaining the positional relationship of the target 100A and the target 500 with the insulating substrate 1.
FIG. 9(b) is a schematic plan view provided for explaining TFTs in an abnormal portion.
Figure 9:
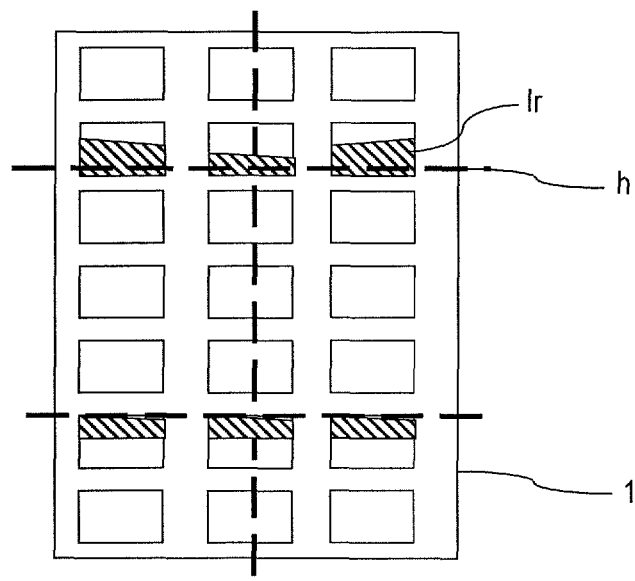
Figure 10:
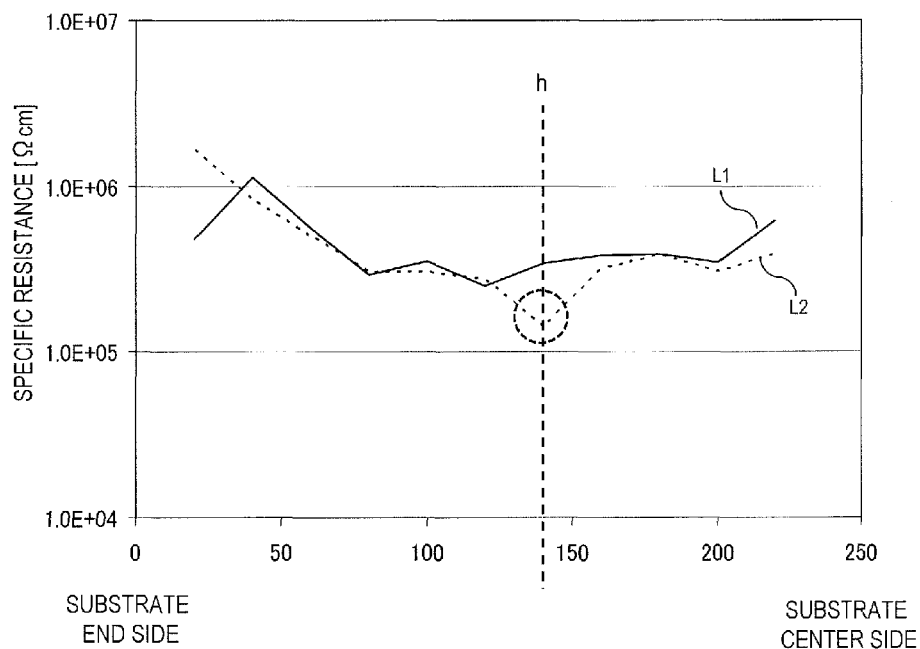
FIG. 10(a) is a graph showing the relationship of the position at which an IGZO layer is formed and the specific resistance of the IGZO layer.
FIG. 10(b) is a graph showing a gate voltage (Vg)-drain current (Id) curve of a TFT in an abnormal portion and a TFT in a normal portion.
Figure 10:
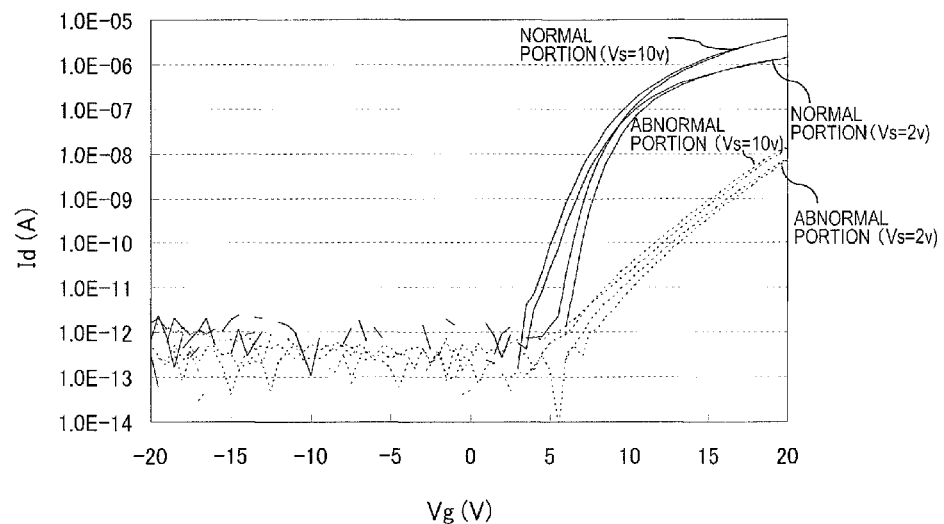

Now, with reference to FIG. 9 through FIG. 11, a TFT characteristic of an oxide semiconductor TFT will be described.

FIG. 9(a) is provided for explaining the positional relationship of the target 100A and the target 500 with the insulating substrate 1 on which the IGZO layer is formed. FIG. 9(b) is a schematic plan view of the insulating substrate provided for explaining an abnormal portion in which the TFT characteristic exhibits an abnormal value when the IGZO layer is formed using the target 500.

As shown in FIG. 9(a), for forming the IGZO film by sputtering, each of the targets 100A and 500 is located so as to cover the insulating substrate 1. Gaps h between adjacent target tiles of each of the targets 100A and 500 are also on the insulating substrate 1. As described above, the target 500 has a structure by which when the target is seen in a direction normal thereto from the side on which the target tiles are located, the bonding member is seen through the gaps h. By contrast, the target 100A does not have such a structure.

Now, FIG. 9(b) will be referred to. According to studies performed by the present inventors, when the target 500 is used, an abnormal portion Ir in which the TFT characteristic is abnormal appears along almost the entirety of the gap h as shown in FIG. 9(b).

FIG. 10(a) is a graph showing the relationship of specific resistance L1 of the IGZO layer formed using the target 100A and specific resistance L2 of the IGZO layer formed using the target 500 with the positions at which each IGZO layer is formed. FIG. 10(b) is a graph showing a gate voltage (Vg)-drain current (Id) curve of a TFT in an abnormal portion and a TFT in a normal portion (portion other than the abnormal portion).

As shown in FIG. 10(a), in the IGZO layer formed using the target 500, a part of the IGZO layer which is at a position corresponding to the gap h has a small specific resistance (e.g., specific resistance: $1.42 \times 10^5$ Ωcm). The IGZO layer formed using the target 100A does not have any such part having a small specific resistance (e.g., specific resistance: $2.00 \times 10^5$ Ωcm or greater).

FIG. 10(b) shows a gate voltage (Vg)-drain current (Id) curve of a TFT in the normal portion and of a TFT in the abnormal portion when the source voltage Vs is 2 V and 10 V. The TFT in the abnormal portion includes the IGZO layer which has the small specific resistance as described above. The TFT in the normal portion does not include such an IGZO layer having a small specific resistance. As can be seen from FIG. 10(b), regardless of whether the source voltage Vs is 2 V or 10 V, the ON current value of the TFT in the abnormal portion is smaller than the ON current value of the TFT in the normal portion.

Based on the above, when an oxide semiconductor TFT is produced by the above-described steps by use of the target 500, a part of the bonding member 57 which is not covered with the target tiles 50 (see FIG. 8) influences the characteristic of the IGZO layer at the time of formation of the IGZO layer. As a result, the IGZO layer does not have a uniform quality on one, same substrate. Therefore, the TFT characteristic of the oxide semiconductor TFTs is not uniform and is dispersed. By contrast, when the target 100A is used, the bonding member 17A is covered with the target tiles 11A (see FIG. 1). Therefore, the influence of the bonding member 17A at the time of formation of the IGZO layer is small. As a result, the IGZO layer has a uniform quality, and the oxide semiconductor TFTs obtained as final products have a uniform characteristic.

Now, conditions for forming of the IGZO film examined by the present inventors will be described with reference to Table 1.

Table 1 shows the conditions for forming of the IGZO film by sputtering examined by the present inventors. The target used for forming the IGZO film by sputtering is the target 500.

TABLE 1

|  | Reference film formation condition | Condition (1) | Condition (2) | Condition (3) | Condition (4) | Condition (5) |
|---|---|---|---|---|---|---|
| Substrate temperature | 200° C. | Room temperature | 110° C. | 200° C. | 200° C. | 200° C. |
| Film formation power density [W/cm$^2$] | 1.53 | 1.53 | 1.53 | 1.22 | 1.83 | 2.44 |
| Film formation pressure Gas flow rate (Ar/O$_2$) | 0.6 Pa (200/9 sccm) | 0.6 Pa (200/9 sccm) | 0.6 Pa (200/9 sccm) | 0.6 Pa (200/9 sccm) | 0.6 Pa (200/9 sccm) | 0.6 Pa (200/9 sccm) |
| O$_2$ concentration | 4.30% | 4.30% | 4.30% | 4.30% | 4.30% | 4.30% |

TABLE 1-continued

|  | Condition (6) | Condition (7) | Condition (8) | Condition (9) | Condition (10) | Condition (11) |
| --- | --- | --- | --- | --- | --- | --- |
| Substrate temperature | 200° C. | 200° C. | 200° C. | 200° C. | 200° C. | 200° C. |
| Film formation power density [W/cm$^2$] | 3.06 | 1.53 | 1.53 | 1.53 | 1.53 | 1.53 |
| Film formation pressure Gas flow rate (Ar/O$_2$) | 0.6 Pa (200/9 sccm) | 0.6 Pa (200/5 sccm) | 0.6 Pa (200/20 sccm) | 0.6 Pa (200/30 sccm) | 0.32 Pa (100/2.5 sccm) | 1.0 Pa (400/10 sccm) |
| O$_2$ concentration | 4.30% | 2.43% | 9.09% | 13.0% | 2.43% | 2.43% |

Regardless of which one of the reference film formation condition and conditions (1) through (11) shown in Table 1 was used to form an IGZO layer by use of the target 500, the quality of the IGZO layer was not uniform. Thus, the TFTs obtained as final products did not have a uniform TFT characteristic.

By contrast, as described above, when an IGZO layer was formed by use of, for example, the target 100A under the reference film formation condition, the quality of the IGZO layer was uniform. Thus, the TFTs obtained as final products had a uniform TFT characteristic.

Based on this, when sputtering is performed by use of a target having a structure by which the bonding member is not seen when the target is seen in a direction normal thereto from the side on which the target tiles are located, the quality of the IGZO layer is uniform. Thus, the TFTs obtained as final products have a uniform TFT characteristic. As a result, semiconductor devices having small dispersion in the TFT characteristic are obtained.

INDUSTRIAL APPLICABILITY

The present invention is widely applicable to the following devices including thin film transistors: circuit boards such as active matrix substrates; display devices such as liquid crystal display devices, organic electroluminescence (EL) display devices, inorganic electroluminescence display devices and the like; image pickup devices such as image sensor devices and the like; electronic devices such as image input devices, fingerprint reading devices and the like. The present invention is especially preferably applicable to large-screen liquid crystal display devices and the like.

REFERENCE SIGNS LIST

1 Insulating substrate
11A, 11B, 11C, 11D, 11E, 50 Target tile
15A, 15B, 15C, 15D, 15E, 55 First backing plate
17A, 17B, 17C, 17D, 17E, 57 Bonding member
23A, 23B, 23C, 23D, 23E, 53 Second backing plate
100A, 100B, 100C, 100D, 100E, 500 Target

The invention claimed is:

1. A method for producing a semiconductor device including an oxide semiconductor, comprising the steps of:
    preparing an insulating substrate; and
    forming an oxide semiconductor layer on the insulating substrate; wherein:
    the step of forming the oxide semiconductor layer includes a step of sputtering a target;
    the target includes:
        a plurality of target tiles arranged to include a gap therebetween;
        a plurality of backing plates arranged to support the plurality of target tiles; and
        a plurality of bonding members provided between the plurality of backing plates and the plurality of target tiles;
    the plurality of target tiles each contain In, Ga and Zn;
    each of the plurality of target tiles is bonded to different respective ones of the plurality of backing plates via different respective ones of the plurality of bonding members; and
    when the target is seen in a direction normal thereto from the side on which the plurality of target tiles are located, the plurality of target tiles are each smaller than the insulating substrate, and the plurality of backing plates and the plurality of bonding members cannot be seen through the gap and also cannot be seen outside of outer peripheries of the plurality of target tiles.

2. The method for producing a semiconductor device of claim 1, wherein when the target is seen in the direction normal thereto from the side on which the plurality of target tiles are located, each of the plurality of target tiles is larger than the different respective ones of the plurality of bonding members.

3. The method for producing a semiconductor device of claim 1, wherein when the target is seen from the direction normal thereto from the side on which the plurality of target tiles are located, each of the plurality of target tiles is larger than the respective one of the plurality of backing plates.

* * * * *